United States Patent [19]

Foss et al.

[11] Patent Number: 5,255,232
[45] Date of Patent: Oct. 19, 1993

[54] DRAM CELL PLATE AND PRECHARGE VOLTAGE GENERATOR

[75] Inventors: Richard C. Foss, Kirkcaldy Fife, Scotland; Valerie L. Lines, Ottawa, Canada

[73] Assignee: Mosaid, Inc., Ontario, Canada

[21] Appl. No.: 680,748

[22] Filed: Apr. 5, 1991

[30] Foreign Application Priority Data

Apr. 6, 1990 [GB] United Kingdom ............... 9007793

[51] Int. Cl.$^5$ .............................................. G11C 11/24
[52] U.S. Cl. ...................................... 365/203; 365/226
[58] Field of Search ................. 365/203, 226; 307/530

[56] References Cited

U.S. PATENT DOCUMENTS

| | | | |
|---|---|---|---|
| 4,769,784 | 9/1988 | Doluca et al. | 365/226 |
| 4,794,571 | 12/1988 | Uchida | 365/203 |
| 4,809,230 | 2/1989 | Konishi et al. | 365/203 |
| 4,839,865 | 6/1989 | Sato et al. | 365/226 |
| 4,943,952 | 7/1990 | Terayama et al. | 365/203 |
| 4,964,084 | 10/1990 | Jung et al. | 365/226 |

*Primary Examiner*—John S. Heyman
*Attorney, Agent, or Firm*—Antonelli, Terry, Stout & Kraus

[57] ABSTRACT

A method and apparatus for precharging memory cell bit storage capacitors and bit lines of a DRAM from a single source. The storage capacitor reference plate is driven from a high impedance voltage divider, minimizing the effects of voltage supply noise, so that noise does not couple into the storage capacitor and turn on the associated capacitor access transistor. At the same time the bit line is driven from a low impedance drive, to enable it to maintain the bit line midpoint voltage. The bit line precharge voltage is referenced to the storage capacitor reference voltage providing good cell margin.

6 Claims, 2 Drawing Sheets

DRAM CELL PLATE AND PRECHARGE VOLTAGE GENERATOR

FIELD OF THE INVENTION

This invention relates to semiconductor memories and in particular to a method and apparatus for charging memory cell bit storage capacitors reference plate and precharing bit lines of a dynamic random access memory (DRAM).

BACKGROUND TO THE INVENTION

DRAMs having folded bit lines are well known, and typically are formed of rows or word lines and columns or bit lines, the columns each being formed of a complementary pair of the bit lines. Storage capacitors are located at the intersection of each word line and column, which store charge designative of zeros and ones. For example, the presence of a charge on a capacitor can signify the existence of a one and the absence of a charge can signify the presence of a zero. The capacitors are connected to the bit lines through access transistors which are enabled from the word lines.

In order to speed reading and writing of the memory, the bit lines are precharged to a voltage $V_{BLP}$ which is half of the supply voltage and the reference plate of the storage capacitor is charged to a voltage $V_{cp}$ which is half of the supply voltage. Precharging the bit lines to half the supply voltage reduces signal swing on the bit lines which reduces peak current and allows faster reading. Using $V_{cp}$ as the storage capacitor reference plate voltage reduces voltage stress on thin capacitor dielectrics.

In prior art DRAMs, separate circuits are required to generate the storage capacitor reference voltage $V_{CP}$ and the bit line precharge voltage $V_{ELP}$. A low impedance drive is required for $V_{BLP}$ to maintain the bit line precharge level, while a high impedance drive is required for $V_{cp}$ to prevent voltage supply noise from charging the storage capacitor reference level and inadvertently enabling the access transistor. Using two separate circuits to generate $V_{cp}$ and $V_{BLP}$ results in $V_{BLP}$ not tracking the $V_{cp}$ voltage.

SUMMARY OF THE INVENTION

The present invention reduces the complexity of the storage capacitor reference voltage and bit line precharge voltage generators, requiring only a single circuit to generate both voltages. The storage capacitor reference plate is driven from a high impedance voltage divider, minimizing the effects of voltage supply noise, so that noise does not couple into the storage capacitor and turn on the associated capacitor access transistor. At the same time the bit line is driven from a low impedance drive, to enable it to maintain the bit line midpoint voltage. The bit line precharge voltage is referenced to the storage capacitor reference voltage, providing good cell margin.

The $V_{cp}$ and $V_{BLP}$ generator circuit is comprised of a potential divider which provides a high impedance drive to the bit storage capacitor reference plate at half the supply voltage level, and provides a unity gain low output impedance amplifier from the same voltage divider to maintain the bit line precharge.

In general, an embodiment of the invention is, in a dynamic random access memory (DRAM), a method of generating a storage capacitor reference voltage and a bit line precharge voltage comprising the steps of providing a voltage source to the DRAM, applying a fraction of the voltage source to the bit line with a low impedance drive, and applying a fraction of the voltage source to the reference plate of the storage capacitor with a high impedance drive.

In accordance with another embodiment, a DRAM is comprised of bit storage capacitors and at least one bit line for receiving stored bits from the storage capacitors, a voltage source, apparatus for generating a storage capacitor reference plate voltage and maintaining a bit line precharge voltage from the same circuit, where the generated voltages are a level which is a fraction of the voltage source.

According to another embodiment, a DRAM is comprised of bit storage capacitors and at least one bit line for receiving stored bits from the storage capacitors, and apparatus for generating a storage capacitor reference plate voltage and a bit line maintaining voltage comprising a supply voltage, a high impedance voltage divider connected across the supply voltage circuit, an output of the voltage divider connected in a circuit to the storage capacitor reference plate, and a unity gain low impedance amplifier having an input connected to the voltage divider and an output connected to a bit line to be maintained at a precharge voltage.

BRIEF INTRODUCTION TO THE DRAWINGS

A better understanding of the invention will be obtained by reference to the detailed description below in conjunction with the following drawings, in which:

FIG. 1 is a logic diagram of a portion of a DRAM in accordance with the prior art, FIG. 2 is a logic diagram of a portion of a DRAM in accordance with the present invention, and FIG. 3 is a block diagram of a portion of FIG. 2.

DESCRIPTION OF A PREFERRED EMBODIMENT OF THE INVENTION

Figure 1:
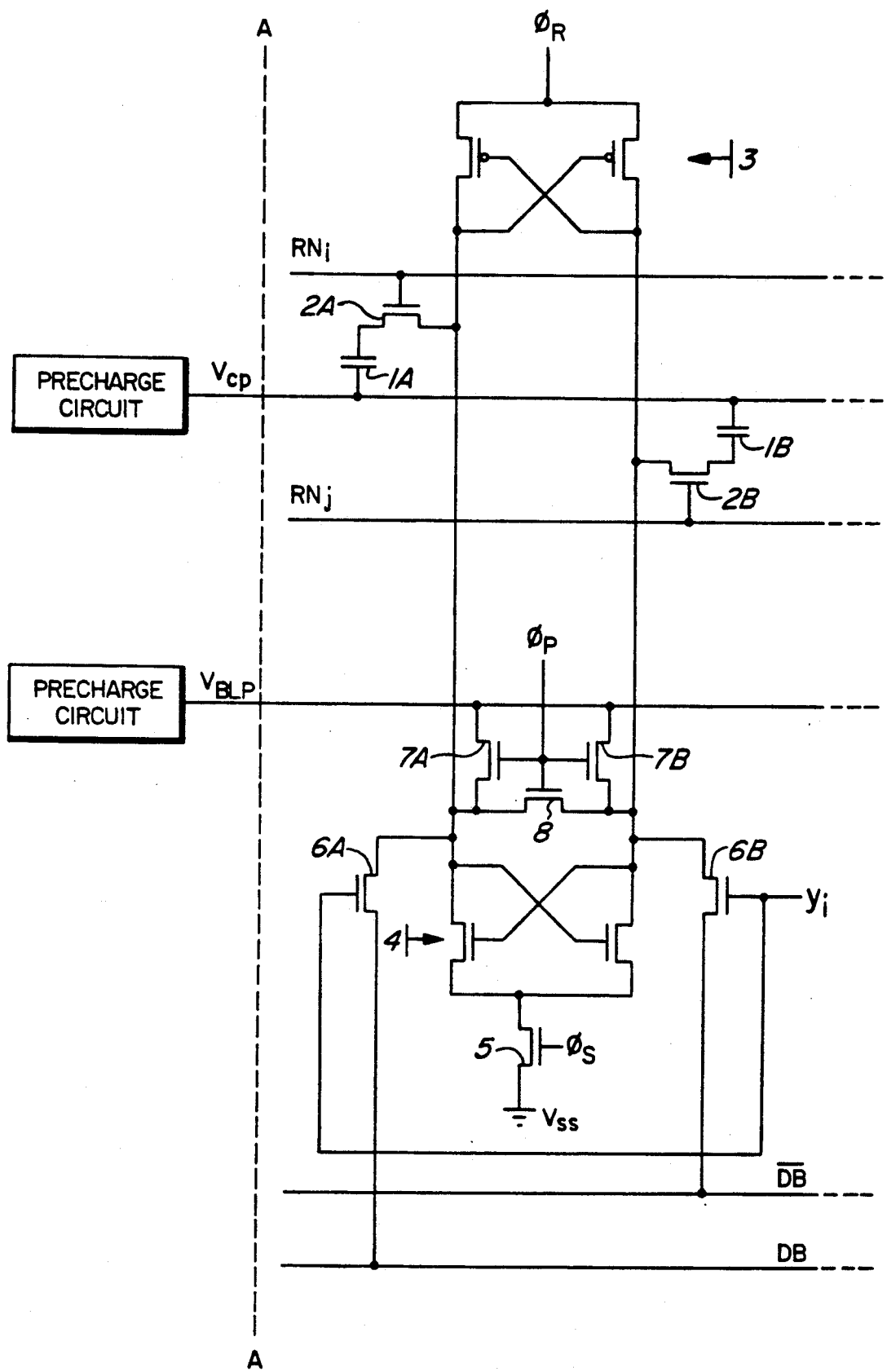

As illustrated in FIG. 1, a representative folded bit line comprised of complementary bit lines BL and /BL is located in a DRAM, in a matrix with row or word lines $RN_i$ and $RN_j$. Bit storage capacitors 1A and 1B are connected between a reference voltage supplied from a voltage generator, $V_{cp}$, and the source of a memory access transistors 2A, 2B respectively. The drains of transistors 2A and 2B are connected respectively to respective bit lines BL and /BL, and the gates of transistors 2A and 2B are connected to word lines $RN_i$ and $RN_j$ respectively. The bit lines are connected to voltage restore latch 3, which is connected to a logic line $\phi_R$. The other end of the bit line pair is connected to a voltage sense latch 4, which is connected through the source-drain circuit of transistor 5 to a voltage source $V_{ss}$. The gate of transistor 5 is connected to a logic line $\phi_S$.

Each bit line of the bit line pair is connected through the source-drain circuit of a corresponding access transistor 6A and 6B to a corresponding data bus DB and /DB. The gates of transistors 6A and 6B are connected to read logic source $Y_i$.

A precharge voltage $V_{BLP}$ is passed through transistors 7A and 7B to the bit line pair, and voltage equalizing transistor 8 has its source-drain circuit connected between the lines of the bit line pair. The gates of transistors 7A, 7B and 8 are connected to a precharge logic line $\phi_p$.

The two voltages $V_{cp}$ and $V_{BLP}$ are generated in two different circuits.

Operation of the above circuit is well known, but a brief recitation will follow. During a precharge phase, a logic level $\phi_p$ enables transistors 7A, 7B and 8. A precharge voltage $V_p$ is passed through transistors 7A and 7B to the bit lines, and transistor 8, equalizes the bit lines. The voltage $V_{BLP}$ is at half the supply voltage level.

To read the charge on storage capacitor 1A, transistor 2A is enabled by a voltage on word line $RN_i$ applied to its gate, which transfers the charge held on capacitor 1A to bit line BL. The result is a voltage differential developed between the respective lines of the bit line pair BL and /BL. The voltage sense latch 4 is enabled by $\phi_s$ going high, which pulls the lower voltage on one of bit lines BL and /BL to ground. The restore latch 3 is enabled by the logic $\phi_R$ so that the higher one of the bit lines BL and /BL is pulled to a full supply voltage (i.e. $V_{dd}$).

Subsequently, transistors 6A and 6B are enabled by means of signal $Y_i$ applied thereto, which couples the differential charge at full logic levels to respective data bus lines DB and /DB, for access by a microprocessor.

At the end of the read cycle, transistors 6A and 6B are disabled disconnecting the bit lines from the data bus lines, the word line $RN_i$ is disabled, and the sense and restore latches are disabled. $\phi_p$ is driven to a high logic level, enabling the equalizing transistor 8 which equals BL and /BL to half of the power supply voltage and maintain transistors 7A and 7B which connect the bit lines to $V_{BLP}$.

Figure 2:
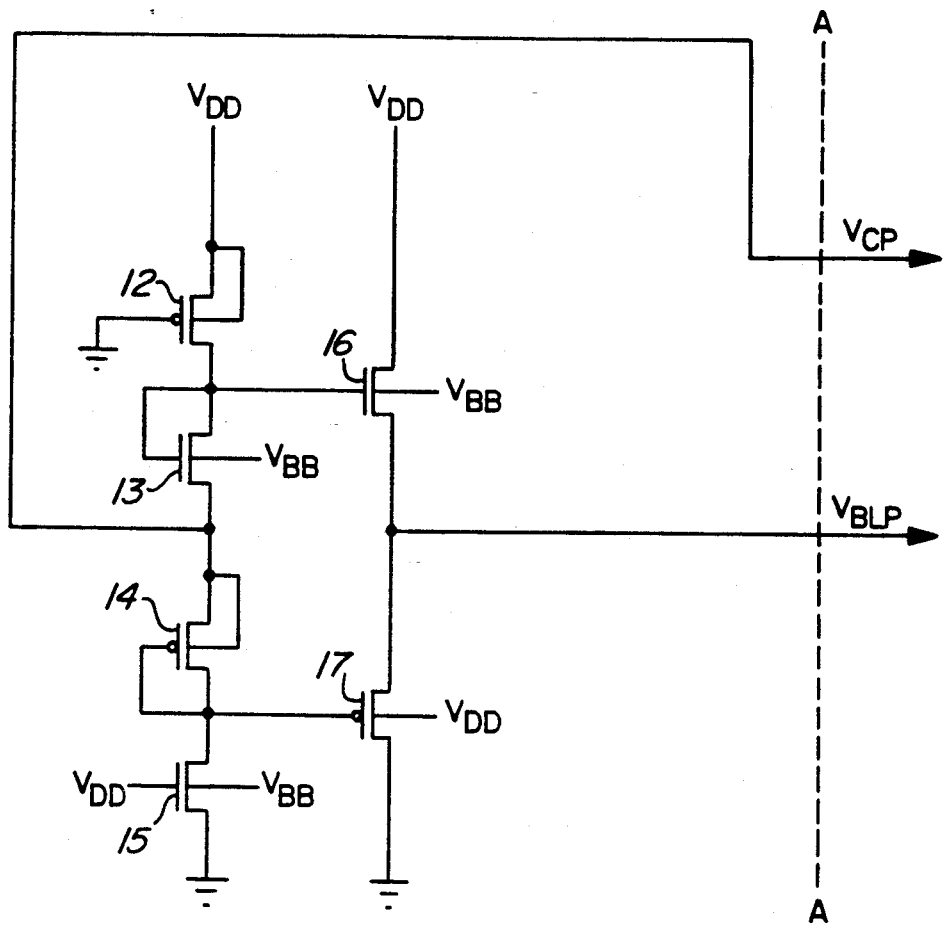

In accordance with the present invention, only a single voltage supply is required. This is shown in FIG. 2. The circuit in FIG. 2 is similar to that of FIG. 1 to the right of the vertical dashed line A—A and is not reproduced again. However the separate sources of the voltage for precharge are not used in the present invention, replaced by the circuit to the left of the dashed line A—A.

According to an embodiment of the invention, a voltage supply circuit shown to the left of dashed line A—A is comprised of a voltage divider which is comprised of P-channel field effect transistor (FET) 12 having its source connected to a source of voltage $V_{dd}$ and its drain connected in series with the drain of N-channel FET 13. The source of transistor 13 is connected in series with the source of P-channel FET 14, which has its drain connected in series with the drain of N-channel FET 15. The gates of transistors 13 and 14 are connected to their respective drains, the gate of transistor 12 is connected to ground, and the gate of transistor 15 is connected to the source of positive voltage $V_{dd}$. The substrates of transistors 13 and 15 are connected to a source of voltage $V_{bb}$, and the substrates of transistors 12 and 14 are connected to their respective sources.

N-channel FET 16 has its source connected to the source of P-channel FET 17. The drain of transistor 16 is connected to $V_{dd}$ and the drain of transistor 17 is connected to ground.

The junction of the sources of transistors 16 and 17 is connected to a bit line precharge line via lead $V_{BLP}$, and the junction of the sources of transistors 13 and 14 is connected to the memory array cell plates via lead $V_{cp}$.

In operation, transistors 12, 13, 14 and 15 form a voltage divider between the supply voltage $V_{dd}$ and ground. The junction of the sources of transistors 13 and 14 thus forms a voltage divider tap at one-half the $V_{dd}$ level. That voltage forms a high impedance drive for charging the bit storage capacitor reference plate via line $V_{cp}$.

Transistors 16 and 17, which are connected between $V_{dd}$ and ground, form a unity gain low output impedance voltage dividing amplifier, driven from the voltages at the junction of transistors 12 and 13, and 14 and 15 respectively. As a result one-half $V_{dd}$ level is applied from their sources via lead $V_{BLP}$ to the bit lines through transistors 7A and 7B, the bit lines having been equalized through the source drain circuit of transistor 8, upon being enabled via line $\phi P$.

Since $V_{BLP}$ and $V_{pc}$ are both derived from the same voltage divider, the bit line precharge and storage capacitor reference plate voltages always track with respect to long term variations in supply voltage.

The connection from the voltage divider to the memory cell plates can be resistive, provided the value of the resistor remains less than the output impedance of the divider, and tracking between $B_{BLP}$ and $V_{CP}$ will be maintained.

While it is preferred that the precharge voltage should be half the supply voltage level, it will be recognized that if in some designs a different precharge voltage is desired, a different voltage division could be used.

Figure 3:
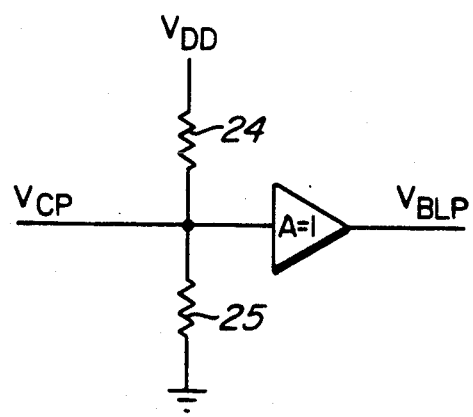

FIG. 3 illustrates in block diagram the conceptual structure of the circuit to the left of the vertical line A—A of FIG. 2. A voltage divider, shown as resistors 24 and 25 is connected between the voltage source $V_{dd}$ and ground. The voltage $V_{cp}$ is taken from the tap of the voltage divider.

The tap of the voltage divider is also connected to the input of unity gain low output impedance amplifier 27, the output of which provides the voltage $V_{BLP}$.

It may be seen that the bit line precharge line $V_{BLP}$ is isolated from the storage capacitor reference line $V_{CP}$ due to amplifier 27. Yet the voltages at $V_{BLP}$ and $V_{CP}$ track because they are derived from the same source.

A person understanding this invention may now conceive of alternative structures and embodiments or variations of the above. All of these which fall within the scope of the claims appended hereto are considered to be part of the present invention.

We claim:

1. A dynamic random access memory (DRAM) comprising bit storage capacitors and at least one bit line for receiving stored bits from said storage capacitors, means for generating a storage capacitor reference plate voltage and a bit line precharge maintaining voltage, comprising voltage supply means, voltage divider means connected across the voltage supply terminal means, a portion of the voltage divider means connected in a high series impedance circuit to a storage capacitor reference plate, a unity gain low impedance amplifier having an input connected to said voltage divider means and an output connected to a bit line to be precharged, the voltage supplied by said portion of the voltage divider means and the voltage supplied to said input of the amplifier by said voltage divider means being sufficient to maintain the storage capacitor reference voltage and maintain the precharge bit line voltage.

2. A DRAM as defined in claim 1 in which the voltage supplied by said portion of the voltage divider means is one half the supply voltage.

3. A DRAM as defined in claim 1 in which said circuit is comprised of a high impedance resistor connected between said storage capacitor reference plate and a tap of said voltage divider means.

4. A dynamic random access memory (DRAM) comprising bit storage capacitors and at least one bit line for receiving stored bits from said storage capacitors, a voltage source, single means for generating a storage capacitor plate reference voltage and a bit line precharge maintaining voltage at a level which is one half of said voltage source, and means for driving said storage capacitor reference plate to said level from a high impedance drive and the bit line from a low impedance drive from said single means.

5. A dynamic random access memory (DRAM) comprising bit storage capacitors and at least one bit line for receiving stored bits from said storage capacitors, means for charging a storage capacitor reference node to a reference voltage level from a high impedance source, means for precharging the bit line to a bit line precharge voltage level from a low impedance source, and means for maintaining said voltage levels such that they track.

6. A DRAM as defined in claim 5 in which said precharge means are coupled together and connected to a single voltage source.

* * * * *